United States Patent [19]

Kushiyama

[11] Patent Number: 5,396,469

[45] Date of Patent: Mar. 7, 1995

[54] SRAM MEMORY REQUIRING REDUCED VOLTAGE SWING DURING WRITE

[75] Inventor: Natsuki Kushiyama, Palo Alto, Calif.

[73] Assignee: Hewlett-Packard Company, Palo Alto, Calif.

[21] Appl. No.: 221,766

[22] Filed: Mar. 31, 1994

[51] Int. Cl.$^6$ .......................................... G11C 11/40
[52] U.S. Cl. .................................. 365/226; 365/203; 365/204; 365/227
[58] Field of Search ............... 365/226, 227, 203, 204, 365/189.01, 202

[56] References Cited

U.S. PATENT DOCUMENTS

| | | | |
|---|---|---|---|
| 4,514,831 | 4/1985 | Oritani ................... | 365/204 |
| 4,712,194 | 12/1987 | Yamaguchi et al. ........... | 365/203 |
| 4,901,284 | 2/1990 | Ochii et al. ................ | 365/226 |
| 5,309,401 | 5/1994 | Suzuki et al. ............... | 365/226 |

*Primary Examiner*—Eugene R. LaRoche
*Assistant Examiner*—Tan Nguyen

[57] ABSTRACT

An SRAM comprising a plurality of SRAM storage cells connected in a plurality of rows and columns. Each storage cell has four terminals. Two terminals provide power for the storage cell, and two terminals are data terminals used in reading and writing the storage cell. The data terminals are connected to first and second bit lines in the storage cell's column via coupling transistors that are controlled by word lines associated with the various rows, there being two such bit lines associated with each column. The memory includes a power system that maintains a first potential difference between the power terminals of a storage cell when the storage cell is being read and a second potential difference between the power terminals when the storage cell is being written. The absolute value of the second potential difference is less than the absolute value of the first potential difference. This arrangement reduces the swing in potential on the bit lines needed to write a storage cell.

5 Claims, 4 Drawing Sheets

SRAM MEMORY REQUIRING REDUCED VOLTAGE SWING DURING WRITE

FIELD OF THE INVENTION

The present invention relates to memories, and more particularly, to an improved static RAM.

BACKGROUND OF THE INVENTION

Static random access memories (SRAMs) are used in numerous applications in which access time is important. A typical memory is constructed from a plurality of SRAM cells connected to bit lines used to read from, and write data into, particular cells. A typical SRAM cell consists of 4 transistors connected as a flip-flop and two transistors that are used to connect the flip-flop to the bit lines.

The bit lines are often quite long, and hence, have a significant capacitance. To write data into an SRAM cell, the potential of at least one of the bit lines must be changed by an amount that is typically equal to the supply voltage. For example, if a "0" is to be written into a memory cell in a system in which the bit lines are precharged to some reference potential, the bit line must swing from the reference potential to zero to write the data and then back to the reference potential. The time needed to complete this swing is large because of the large capacitance of the bit line. Hence, if a read operation, i.e., an operation requiring the bit lines to be precharged, is performed after a write, the read requires more time to complete, because the system must wait for one of the bit lines to return to the precharge potential.

In addition to increasing the time needed to read data after a write, the need to swing the bit lines through the full voltage range also requires a significant amount to power. The power consumption is proportional to the voltage swing on the bit lines. In memories having large word lengths, the number of bit lines being written simultaneously may be large. Hence, power consumption during write operations can be a significant problem in such memories.

Broadly, it is the object of the present invention to provide an improved SRAM.

It is a further object of the present invention to provide an SRAM in which the bit lines are not required to swing through the full voltage range during a write operation.

It is a still further object of the present invention to provide a SRAM with reduced power consumption.

These and other objects of the present invention will become apparent to those skilled in the art from the following detailed description of the invention and the accompanying drawings.

SUMMARY OF THE INVENTION

The present invention is an SRAM comprising a plurality of SRAM storage cells connected in a plurality of rows and columns. Each storage cell has four terminals. Two terminals provide power for the storage cell, and two terminals are data terminals used in reading and writing the storage cell. The data terminals are connected to first and second bit lines in the storage cell's column via coupling transistors that are controlled by word lines associated with the various rows, there being two such bit lines associated with each column. The memory includes a power system that maintains a first potential difference between the power terminals of a storage cell when the storage cell is being read and a second potential difference between the power terminals when the storage cell is being written. The absolute value of the second potential difference is less than the absolute value of the first potential difference. The bit lines are connected to a reference potential by transistors that remain conducting during write operations. The resistance of the conducting transistors is sufficient to allow the potential of each bit line to be varied slightly from the reference potential during write operations.

DETAILED OF THE INVENTION

Figure 1:
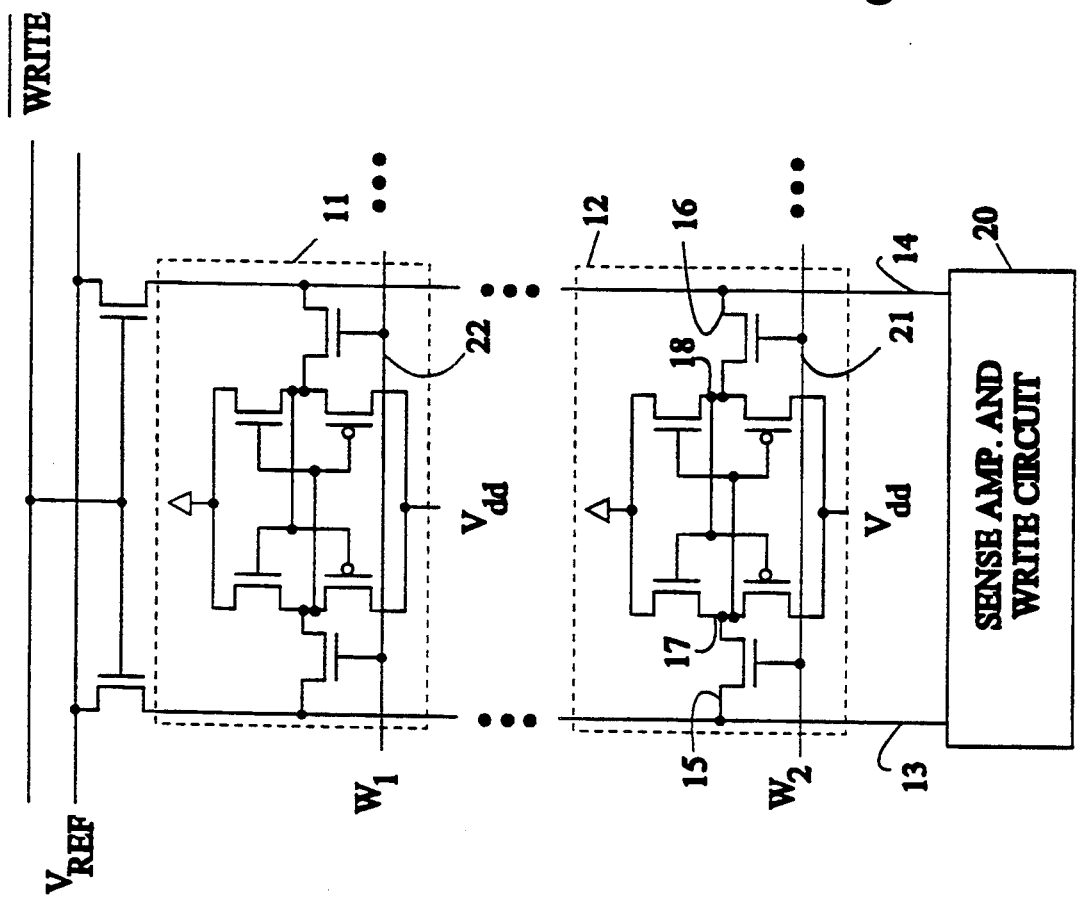
FIG. 1 is a schematic drawing of one column of a conventional SRAM.

The advantages of the present invention may be more easily understood with reference to a conventional SRAM. In general, the memory is organized as a two dimensional array of SRAM cells. The array has a plurality of rows and columns. One such column is shown in FIG. 1. Each column has a plurality of SRAM cells of which SRAM cells 11 and 12 are typical. The SRAM cells in each column may be connected to bit lines, there being two such bit lines per column. In FIG. 1, the bit lines are shown at 13 and 14. The SRAM cells are connected to the bit lines with the aid of coupling transistors such as transistors 15 and 16 shown in SRAM cell 12. A specific cell is selected for connection to the bit lines by appropriate logic signals applied to its word line. The word lines for SRAM cells 11 and 12 are shown at 21 and 22, respectively. All of the SRAM cells in a given row are connected to the same word line.

The data stored in a particular SRAM cell is detected by connecting the SRAM cell to a sense amplifier in circuit 20 via the bit lines. To reduce the time needed to read the SRAM cells, the bit lines are normally precharged to a reference potential, $V_{ref}$.

During write operations, the bit lines are disconnected from the reference potential. Consider the case in which the data stored in SRAM 12 is to be changed from a "1" to a "0". In this case, junction 17 will be high and junction 18 will be low. To switch the states, bit line 13 must be brought from $V_{ref}$ to 0 while bringing bit line 14 high. Since the high voltage is near $V_{ref}$, this requires discharging bit line 13. At the end of the write cycle, bit line 13 must be recharged. Since the bit lines are long, these lines have a significant capacitance. Thus, the time and power needed to re-charge the bit lines is significant.

Figure 2:
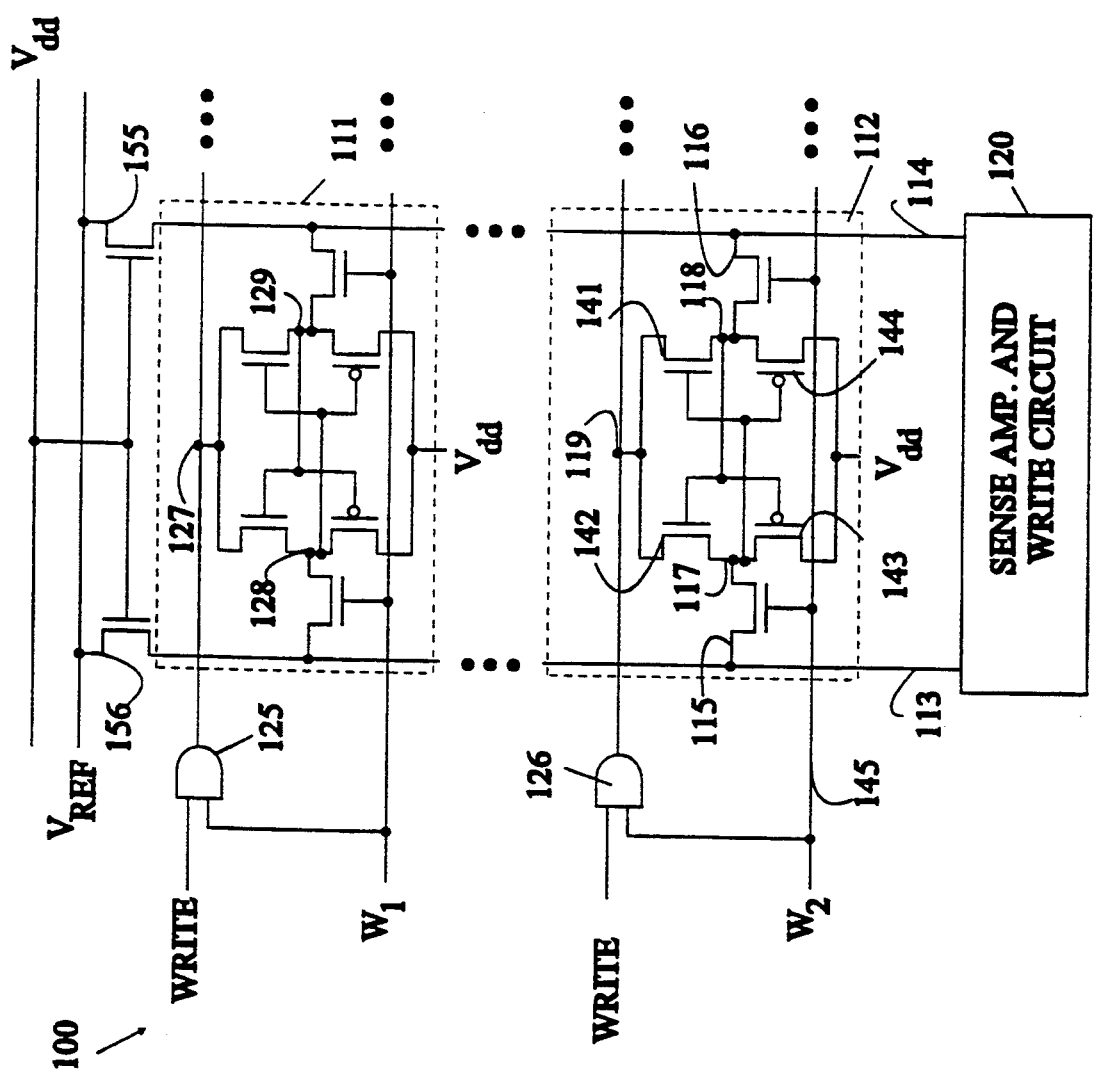
FIG. 2 is a schematic drawing of a column of a SRAM according to the present invention.

The present invention avoids this delay by reducing the voltage swing needed to write the SRAM cell. This is accomplished by altering the potential difference between common node 19 of the memory cell and junction 17 during the write cycle. Refer now to FIG. 2 which is a schematic drawing of a column of a SRAM 100 according to the present invention. Exemplary SRAM cells are shown at 111 and 112. Each SRAM cell includes 4 transistors forming a storage cell and two isolation transistors for connecting the storage cell to the bit lines 113 and 114 when the storage cell is selected for reading or writing by applying a high logic level to the word line connected to the isolation transistors. The isolation transistors in SRAM cell 112 are shown at 115 and 116. The storage cell in SRAM cell 112 are shown at 141–144. Storage cell 112 is selected by providing a high level on line 145.

The present invention differs from prior art SRAMs in that node 119 which is connected to ground during read operations, is connected to the high reference potential on line 145 during write operations by AND gate 126 which applies the potential on $W_2$ to node 119 during a write operation as indicated by the WRITE signal. The present invention also differs from prior art SRAM memories in that the gates of the precharge transistors 155 and 156 are connected to $V_{dd}$. Hence, the bit lines 113 and 114 are always connected to $V_{ref}$ by the precharge transistors. Since the precharge transistors have some resistance, the potential on the bit lines can be forced up or down slightly relative to $V_{ref}$ by write circuit 120. While the embodiment of the present invention shown in FIG. 2 uses precharge transistors, it will be apparent to those skilled in the art that other resistive elements may be used in place of the precharge transistors. These elements allow the bit line potentials to be varied about $V_{ref}$ by some predetermined amount that is sufficient to allow the state of the SRAM cells to be changed.

When the SRAM cell is being read, the WRITE signal is low. In this case, the potential at node 119 is low, and SRAM cell 112 performs in the same manner as a conventional SRAM cell.

The present invention is based on the observation that the voltage swing on the bit lines needed to latch new data in the storage cell depends on the potential difference between node 119 and $V_{dd}$. Consider the case in which SRAM cell 112 is to be switched from a "1" to a "0". In this case, node 117 will be high and node 118 will be low. That is, transistors 141 and 143 will be conducting, and transistors 144 and 142 will be non-conducting. If the potential of node 119 is taken high, then node 118 will rise to the potential on node 119 less the voltage drop across transistor 141 when the transistor is conducting. Node 117 will remain high. If the potential on bit line 113 is reduced slightly while that on bit line 114 is increased slightly, the new data will be latched into the storage cell. To assure reliable operation, the signal at node 119 should go low before the select signal on $W_2$ goes low to assure that the data is properly latched into the storage cell. The voltage patterns on the various sense lines when cell 112 is written followed by a read of cell 111 are shown in FIG. 3.

Figure 3:
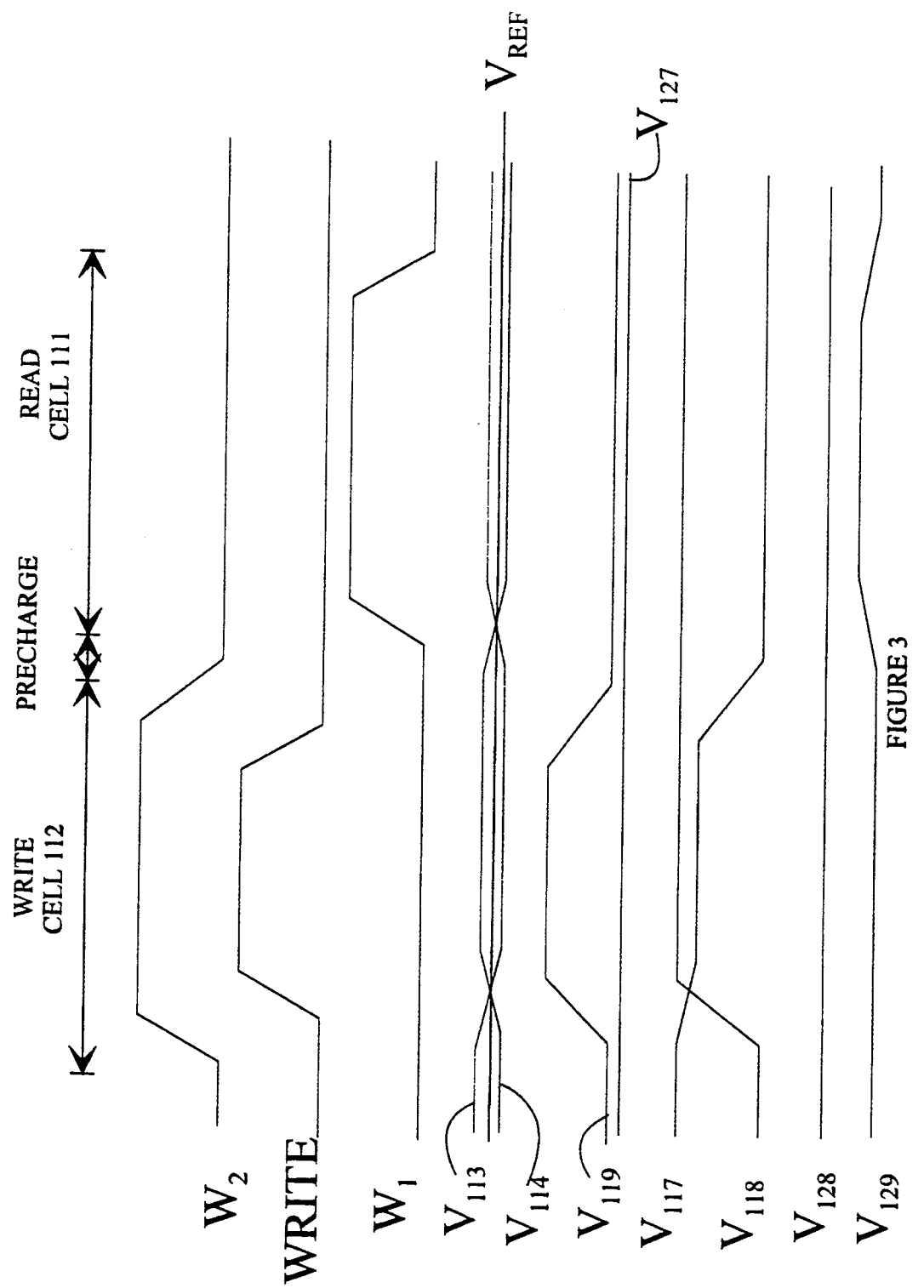
FIG. 3 illustrates the potentials at various points in the SRAM shown in FIG. 2 when cells are read and written.

The embodiment of the present invention shown in FIG. 3 utilizes a 4 transistor storage cell with two isolation transistors. However, the present invention may also be practiced with a 2 transistor and two resistor storage cell. In this case, transistors 143 and 144 shown in FIG. 3 would be replaced by resistors.

Figure 4:
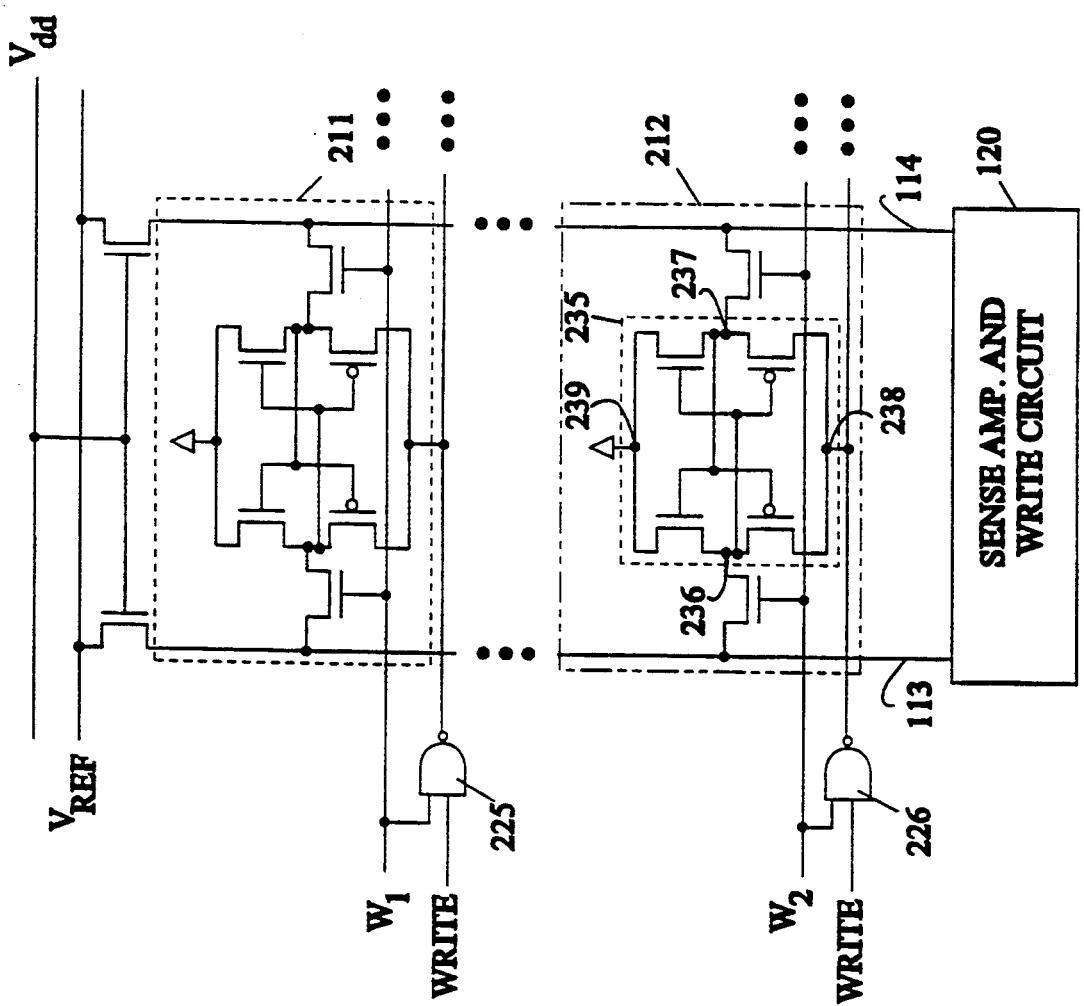
FIG. 4 is a schematic drawing of a second embodiment of a SRAM according to the present invention.

While the above embodiments of the present invention operated by altering the potential of the "ground" terminal of the SRAM cell during writing, embodiments of the present invention in which the potential of the "$V_{dd}$" terminal is altered during writing may also be constructed. The key to reducing the voltage swing on the bit lines lies in reducing the voltage across the SRAM cell during write. This can be accomplished by raising the potential on the ground terminal or lowering the potential on the power terminal. An embodiment of the present invention which operates by altering the potential on the power terminal is shown in FIG. 4. FIG. 4 is a schematic drawing of one column of an SRAM. Two representative SRAM cells are shown at 211 and 212. Refer now to SRAM cell 212. SRAM cell 212 may be viewed as having a 4 terminal storage cell 235 which is coupled to bit lines 113 and 114 via two isolation transistors. The two terminals used for coupling storage cell 235 to bit lines 113 and 114 are shown at 236 and 237. The remaining two terminals, 238 and 239, are used for powering storage cell 235. During read operations, these two terminals are held at ground and a potential near that of $V_{dd}$. Terminal 238 will be referred to as the power terminal. In the embodiment of the present invention shown in FIG. 4, the potential on the power terminal is lowered during write operations through the action of NAND gate 226. With this exception, the embodiment of the present invention shown in FIG. 4 operates in the same manner as that shown in FIG. 2.

Various modifications to the present invention will become apparent to those skilled in the art from the foregoing description and accompanying drawings. Accordingly, the present invention is to be limited solely by the scope of the following claims.

What is claimed is:

1. An SRAM comprising:
   a plurality of SRAM storage cells connected in a plurality of rows and columns, each said column having a first and second bit line associated therewith, each said storage cell having first and second power terminals for powering said storage cell and first and second data terminals for connecting said storage cell to said first and second bit lines in said storage cell's column; and
   power means for maintaining a first potential difference between said first and second power terminals of one of said storage cells when said storage cell is being read and a second potential difference between said first and second power terminals of said storage cell when said storage cell is being written, the absolute value of said second potential difference being less than the absolute value of said first potential difference.

2. The SRAM of claim 1 wherein said first and second bit lines are each connected to a reference potential via a circuit element having a non-zero resistance chosen such that the potential of said bit lines may be varied from said reference potential.

3. The SRAM of claim 2 wherein said circuit element is a FET.

4. The SRAM of claim 1 wherein said SRAM storage cells comprise 4 transistors connected as two cross-coupled inverters.

5. The SRAM of claim 1 wherein said SRAM storage cells comprise two transistors and two resistors.

* * * * *